United States Patent
Schulze et al.

(10) Patent No.: US 9,583,578 B2
(45) Date of Patent: Feb. 28, 2017

(54) SEMICONDUCTOR DEVICE INCLUDING AN EDGE AREA AND METHOD OF MANUFACTURING A SEMICONDUCTOR DEVICE

(71) Applicant: Infineon Technologies AG, Neubiberg (DE)

(72) Inventors: Hans-Joachim Schulze, Taufkirchen (DE); Anton Mauder, Kolbermoor (DE); Franz Hirler, Isen (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/754,957

(22) Filed: Jan. 31, 2013

(65) Prior Publication Data
US 2014/0209970 A1 Jul. 31, 2014

(51) Int. Cl.
*H01L 21/12* (2006.01)
*H01L 29/66* (2006.01)
*H01L 29/36* (2006.01)
*H01L 21/04* (2006.01)
*H01L 29/739* (2006.01)
(Continued)

(52) U.S. Cl.
CPC ............. *H01L 29/36* (2013.01); *H01L 21/04* (2013.01); *H01L 29/0623* (2013.01);
(Continued)

(58) Field of Classification Search
CPC ..... H01L 29/36; H01L 21/04; H01L 29/0623; H01L 29/0834; H01L 29/66136;
(Continued)

(56) References Cited

U.S. PATENT DOCUMENTS 6,465,863 B1 * 10/2002 Deboy ................ H01L 29/0634
257/495
6,479,876 B1 * 11/2002 Deboy ................ H01L 29/0634
257/341
(Continued)

FOREIGN PATENT DOCUMENTS

DE 3831279 A1 3/1990
DE 19713962 C1 7/1998
(Continued)

OTHER PUBLICATIONS

S. Wolfe and R.N. Tauber, Silicon Processing for the VLSI Era, vol. 1, 2nd Ed., 2000 (Wolfe et al.).*

*Primary Examiner* — Tucker J Wright
*Assistant Examiner* — Stephen C Smith
(74) *Attorney, Agent, or Firm* — Murphy, Bilak & Homiller, PLLC

(57) ABSTRACT

A semiconductor portion of a semiconductor device includes a semiconductor layer with a drift zone of a first conductivity type and at least one impurity zone of a second, opposite conductivity type. The impurity zone adjoins a first surface of the semiconductor portion in an element area. A connection layer directly adjoins the semiconductor layer opposite to the first surface. At a distance to the first surface an overcompensation zone is formed in an edge area that surrounds the element area. The overcompensation zone and the connection layer have opposite conductivity types. In a direction vertical to the first surface, a portion of the drift zone is arranged between the first surface and the overcompensation zone. In case of locally high current densities, the overcompensation zone injects charge carriers into the semiconductor layer that locally counter a further increase of electric field strength and reduce the risk of avalanche breakdown.

23 Claims, 11 Drawing Sheets

(51) Int. Cl.
*H01L 29/861* (2006.01)
*H01L 29/08* (2006.01)
*H01L 29/78* (2006.01)
*H01L 29/40* (2006.01)
*H01L 29/06* (2006.01)
*H01L 29/417* (2006.01)
*H01L 29/423* (2006.01)
*H01L 29/10* (2006.01)

(52) U.S. Cl.
CPC .... *H01L 29/0834* (2013.01); *H01L 29/66128* (2013.01); *H01L 29/66136* (2013.01); *H01L 29/66348* (2013.01); *H01L 29/66712* (2013.01); *H01L 29/66734* (2013.01); *H01L 29/7397* (2013.01); *H01L 29/7811* (2013.01); *H01L 29/7813* (2013.01); *H01L 29/8611* (2013.01); *H01L 29/0615* (2013.01); *H01L 29/0634* (2013.01); *H01L 29/0847* (2013.01); *H01L 29/0878* (2013.01); *H01L 29/1095* (2013.01); *H01L 29/402* (2013.01); *H01L 29/407* (2013.01); *H01L 29/41741* (2013.01); *H01L 29/42368* (2013.01)

(58) Field of Classification Search
CPC ......... H01L 29/66348; H01L 29/66712; H01L 29/66734; H01L 29/7397; H01L 29/7813; H01L 29/8611; H01L 29/0615; H01L 29/0634; H01L 29/0846; H01L 29/0878; H01L 29/1095; H01L 29/402; H01L 29/407; H01L 29/41741; H01L 29/42368
See application file for complete search history.

(56) References Cited

U.S. PATENT DOCUMENTS

| | | | | |
|---|---|---|---|---|
| 6,551,909 B1 * | 4/2003 | Fujihira | | 438/510 |
| 6,825,513 B2 * | 11/2004 | ElHatem | | 257/263 |
| 6,844,592 B2 * | 1/2005 | Yamaguchi | H01L | 29/0634 |
| | | | | 257/133 |
| 6,900,109 B2 * | 5/2005 | Onishi | H01L | 29/0634 |
| | | | 257/E21.418 |
| 6,960,798 B2 * | 11/2005 | Deboy et al. | | 257/285 |
| 7,067,376 B2 * | 6/2006 | Blanchard | | 438/268 |
| 7,317,225 B2 * | 1/2008 | Saito | H01L | 29/0634 |
| | | | | 257/328 |
| 7,462,909 B2 * | 12/2008 | Saito | H01L | 29/0634 |
| | | | | 257/329 |
| 7,554,137 B2 * | 6/2009 | Sedlmaier et al. | | 257/263 |
| 7,635,909 B2 * | 12/2009 | Mauder | H01L | 29/0834 |
| | | | | 257/154 |
| 7,696,600 B2 * | 4/2010 | Mauder | H01L | 29/0834 |
| | | | | 257/361 |
| 7,745,885 B2 * | 6/2010 | Blanchard | | 257/401 |
| 7,812,427 B2 * | 10/2010 | Mauder et al. | | 257/653 |
| 7,915,675 B2 * | 3/2011 | Schulze | H01L | 27/0761 |
| | | | | 257/335 |
| 8,012,832 B2 * | 9/2011 | Saggio et al. | | 438/268 |
| 8,110,868 B2 * | 2/2012 | Pfirsch et al. | | 257/328 |
| 8,450,795 B2 * | 5/2013 | Blanchard | | 257/330 |
| 8,569,150 B2 * | 10/2013 | Willmeroth et al. | | 438/478 |
| 8,779,509 B2 * | 7/2014 | Schulze | H01L | 29/7811 |
| | | | | 257/333 |
| 9,006,062 B2 * | 4/2015 | Schulze | H01L | 29/7811 |
| | | | | 438/268 |
| 2005/0156235 A1 * | 7/2005 | Fujihira | H01L | 29/0619 |
| | | | | 257/341 |
| 2006/0231917 A1 * | 10/2006 | Ono | H01L | 29/0634 |
| | | | | 257/500 |
| 2010/0078775 A1 * | 4/2010 | Mauder et al. | | 257/655 |
| 2010/0117117 A1 * | 5/2010 | Ruething et al. | | 257/139 |
| 2010/0258840 A1 * | 10/2010 | Schulze | | 257/139 |

FOREIGN PATENT DOCUMENTS

DE 102006036347 A1 4/2008
DE 10100802 C1 8/2008

* cited by examiner

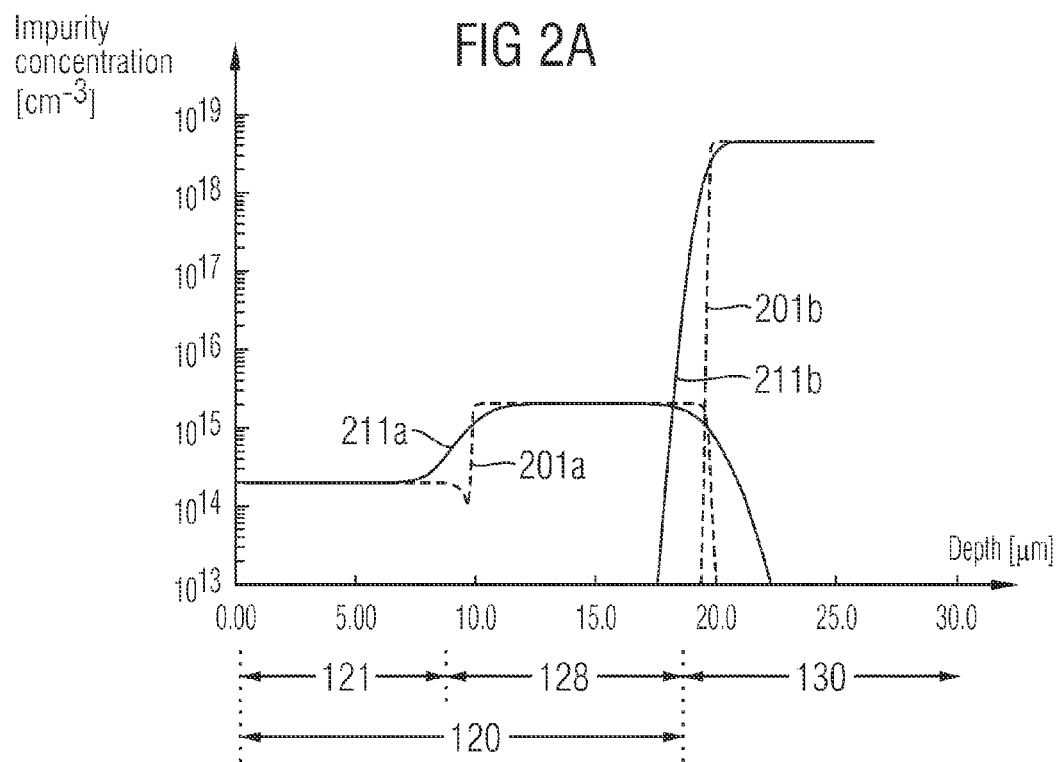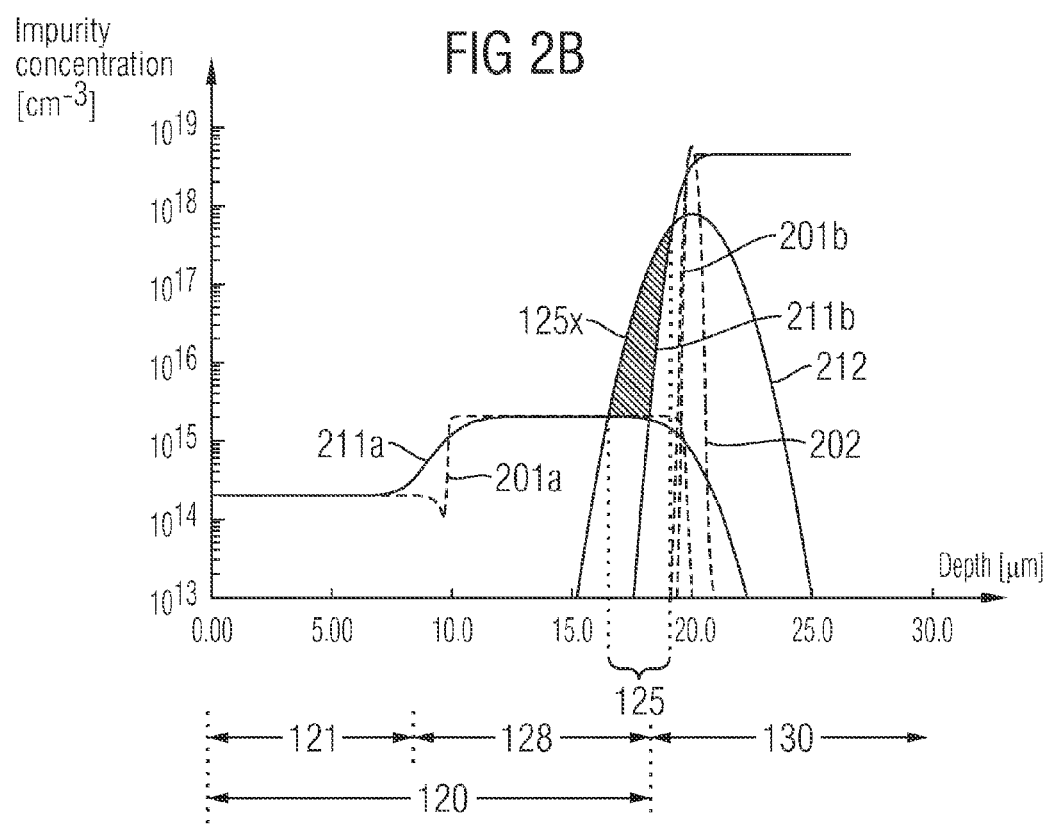

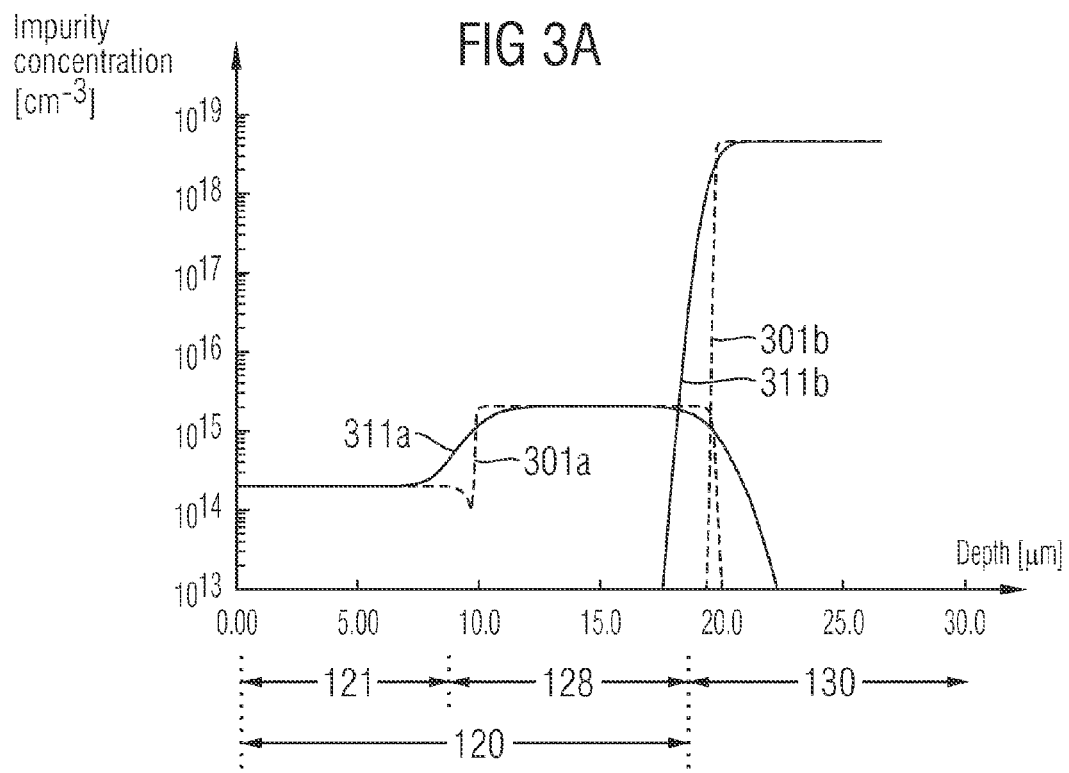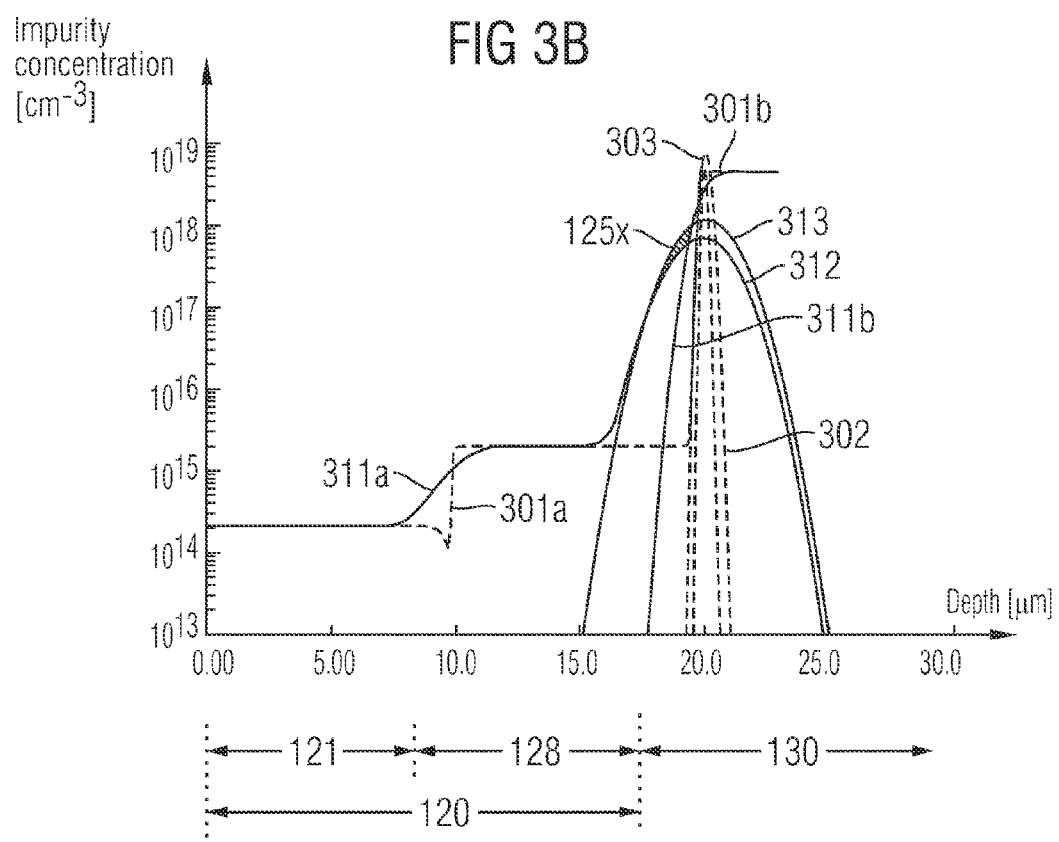

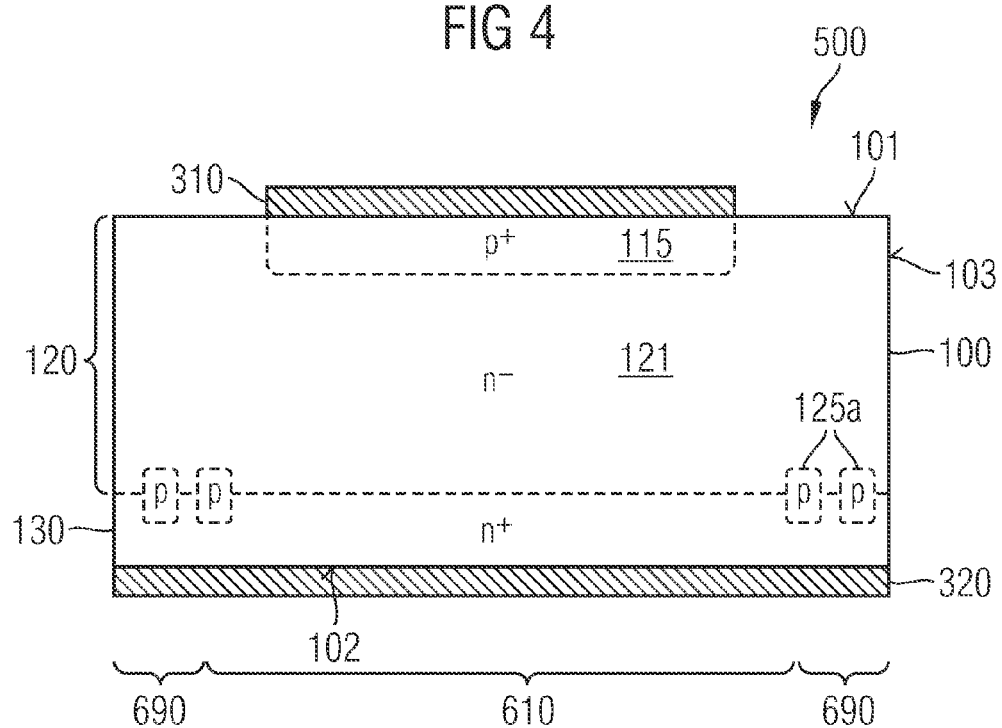
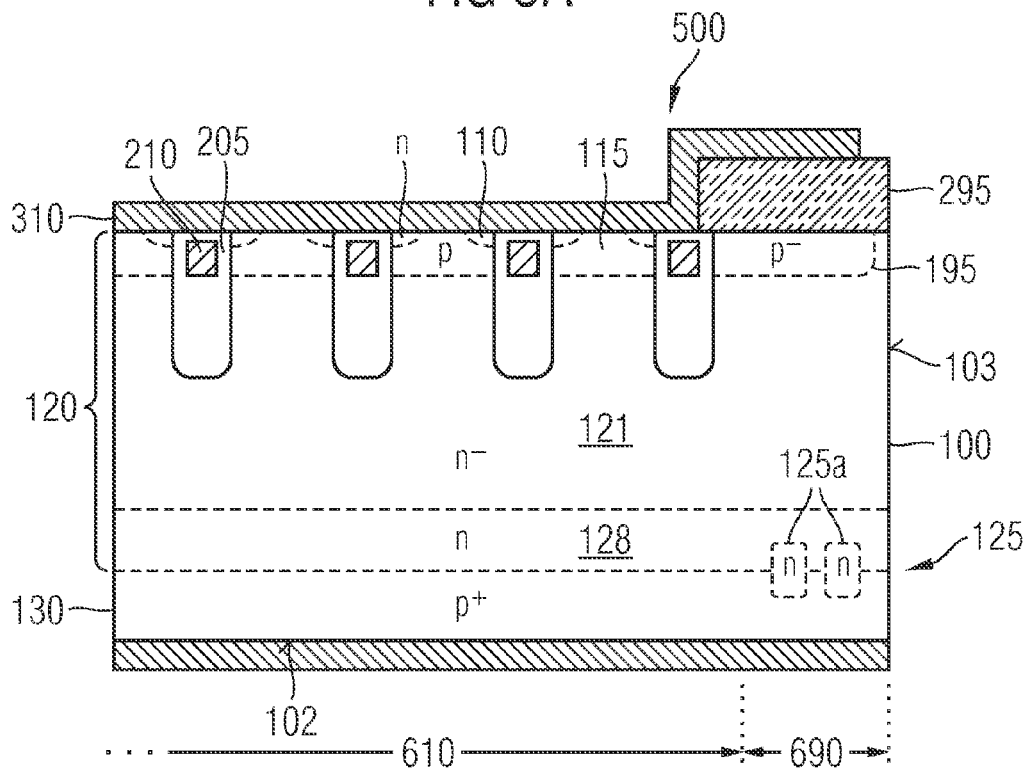

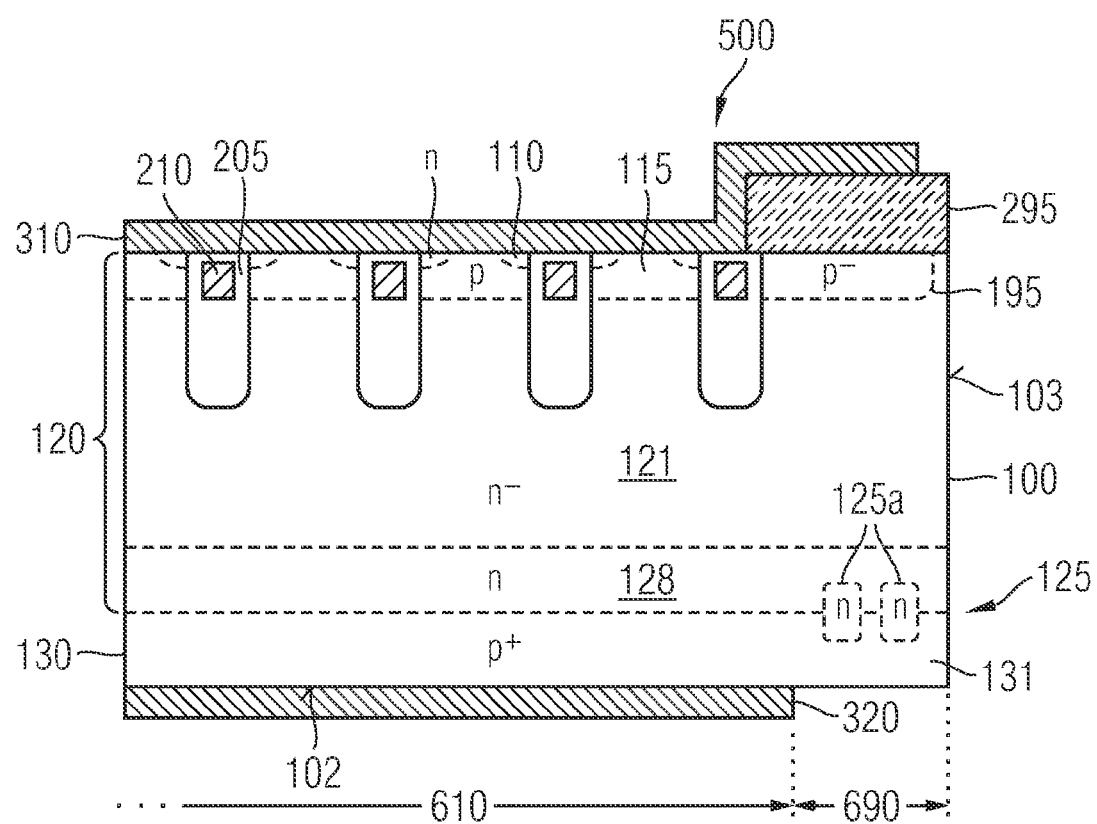

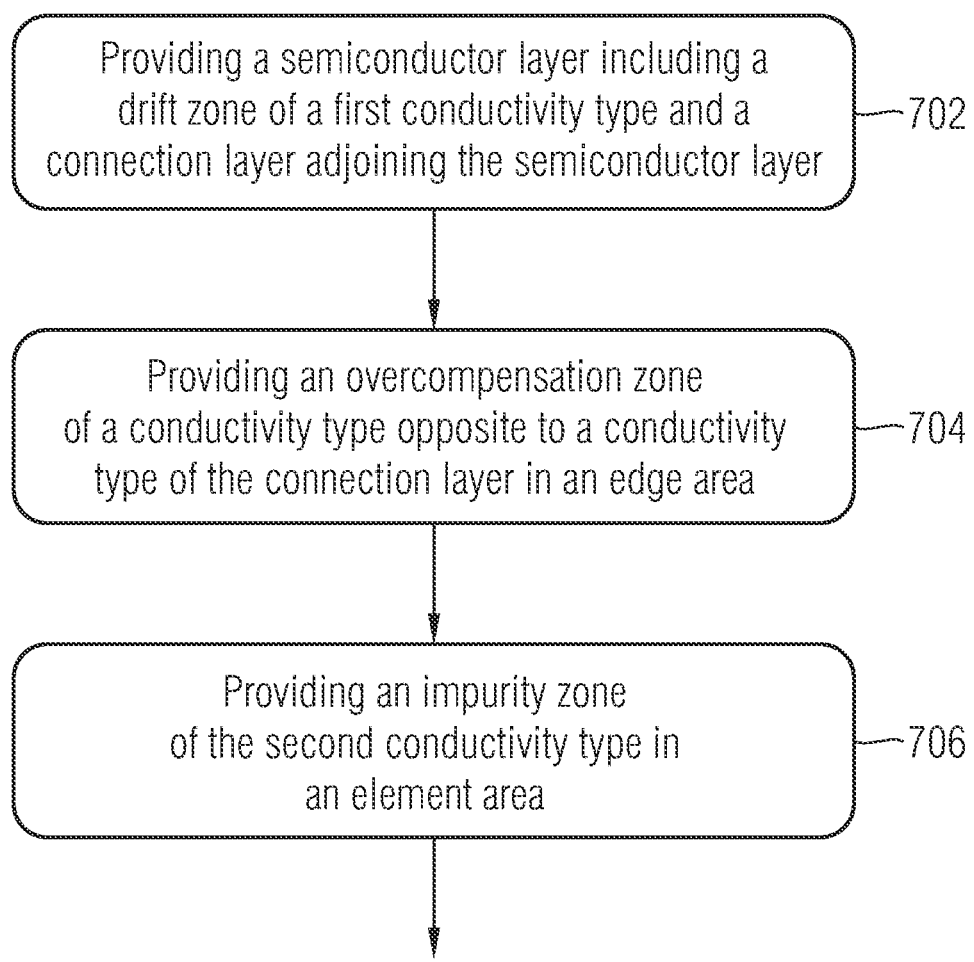

SEMICONDUCTOR DEVICE INCLUDING AN EDGE AREA AND METHOD OF MANUFACTURING A SEMICONDUCTOR DEVICE

BACKGROUND

Power semiconductor devices are used as switches in power electronic circuits for switching on and off loads supplied with high currents. Usually power semiconductor devices are able to carry a high electric current in a conductive mode and to withstand high blocking voltages in a reverse blocking and/or forward blocking mode. Edge termination structures smooth electric field profiles in an edge area surrounding the active element area in the blocking mode such that the maximum electric field strength in the edge area at least approximates the maximum electrical field strength in the element area. The edge termination structure of a semiconductor device with an n type drift layer may include field electrodes arranged in trenches and p type zones directly below and adjoining the trenches. The p type zones smooth the curvature of equipotential lines in the edge area.

It is desirable to improve the reliability of semiconductor devices.

SUMMARY

According to an embodiment a semiconductor portion of a semiconductor device includes a semiconductor layer with a drift zone of a first conductivity type and at least one impurity zone of a second conductivity type which is the opposite of the first conductivity type. The impurity zone adjoins a first surface of the semiconductor portion in an element area. A connection layer directly adjoins the semiconductor layer opposite to the first surface. A mean impurity concentration in the connection layer is at least ten times greater than a mean impurity concentration in the drift zone. An overcompensation zone is provided in an edge area surrounding the element area. The overcompensation zone and the connection layer have opposite conductivity types. In a direction vertical to the first surface, a portion of the drift zone is arranged between the first surface and the overcompensation zone.

Another embodiment refers to a power field effect transistor with a semiconductor portion that includes a semiconductor layer including a drift zone of a first conductivity type. At least one impurity zone of a second, opposite conductivity type directly adjoins a first surface of the semiconductor portion in an element area. A connection layer of the first conductivity type directly adjoins the semiconductor layer opposite to the first surface. A mean impurity concentration in the connection layer is at least ten times greater than a mean impurity concentration in the drift zone. An overcompensation zone of the second conductivity type is formed in an edge area surrounding the element area In a direction vertical to the first surface, a portion of the drift zone is arranged between the first surface and the overcompensation zone.

A semiconductor portion of a power insulated gate bipolar transistor includes a semiconductor layer with a drift zone of a first conductivity type and at least one impurity zone of a second conductivity type, which is the opposite of the first conductivity type. The impurity zone directly adjoins a first surface of the semiconductor portion in an element area. A connection layer of the second conductivity type directly adjoins the semiconductor layer opposite to the first surface. A mean impurity concentration in the connection layer is at least ten times greater than a mean impurity concentration in the drift zone. An overcompensation zone of the second conductivity type is formed in an edge area surrounding the element area. In a direction vertical to the first surface, a portion of the drift zone is arranged between the first surface and the overcompensation zone.

Another embodiment provides a method of manufacturing a semiconductor device. A semiconductor layer that includes a drift zone of a first conductivity type is provided, wherein the semiconductor layer adjoins a connection layer. A mean impurity concentration in the connection layer is at least ten times a mean impurity concentration in the drift zone. An overcompensation zone of a conductivity type, which is the opposite of the conductivity type of the connection layer, is provided in an edge area surrounding an element area, wherein in a direction vertical to an interface between the connection layer and the semiconductor layer a portion of the drift zone is arranged between the first surface and the overcompensation zone. In the element area at least one impurity zone of a second conductivity type, which is complementary to the first conductivity type is provided that adjoins a first surface of the semiconductor layer opposite to the connection layer.

Those skilled in the art will recognize additional features and advantages upon reading the following detailed description, and on viewing the accompanying drawings.

BRIEF DESCRIPTION OF THE DRAWINGS

The accompanying drawings are included to provide a further understanding of the invention and are incorporated in and constitute a part of the specification. The drawings illustrate the embodiments of the present invention and together with the description serve to explain principles of the invention. Other embodiments of the invention and intended advantages will be readily appreciated as they become better understood by reference to the following detailed description. The elements of the drawings are not necessarily to scale relative to each other. Like reference numerals designate corresponding similar parts.

FIG. 2A is a diagram showing impurity profiles along line I-I in an element area of the semiconductor portion of FIG. 1A in accordance with an embodiment referring to two epitaxial layers on a highly doped connection layer.

FIG. 2B is a diagram showing the impurity profiles along line II-II in an edge area of the semiconductor portion of FIG. 1A in accordance with the embodiment of FIG. 2A.

FIG. 3A is a schematic diagram showing impurity profiles along line I-I in an element area of the semiconductor portion of FIG. 1A in accordance with an embodiment related to a co-implantation.

FIG. 3B is a schematic diagram showing impurity profiles along line II-II in an edge area of the semiconductor device of FIG. 1B in accordance with the embodiment of FIG. 3A.

FIG. 4 is a schematic cross-sectional view of a semiconductor diode with an overcompensation zone in accordance with a further embodiment.

FIG. 5A is a schematic cross-sectional view of an IGBT (insulated gate bipolar transistor) with an overcompensation zone in accordance with a further embodiment.

FIG. 5B is a schematic cross-sectional view of an IGBT with an overcompensation zone in accordance with an embodiment providing a high dynamic robustness region.

FIG. 7 is a simplified flow-chart of a method of manufacturing a semiconductor device in accordance with another embodiment.

DETAILED DESCRIPTION

In the following detailed description, reference is made to the accompanying drawings, which form a part hereof, and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements or manufacturing processes have been designated by the same references in the different drawings if not stated otherwise.

The terms "having", "containing", "including", "comprising" and the like are open and the terms indicate the presence of stated elements or features but not preclude additional elements of features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal, a metal compound and/or a highly doped semiconductor material.

The Figures illustrate relative doping concentrations by indicating "−" or "+" next to the doping type "n" and "p". For example "n−" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

Figure 1A:
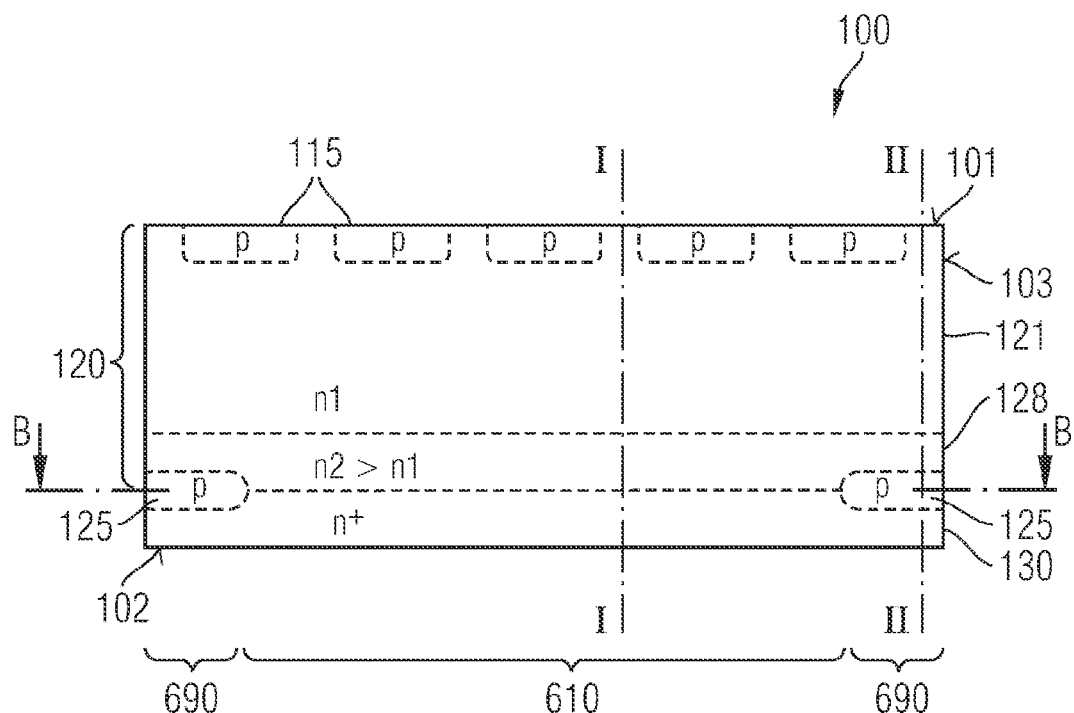
FIG. 1A is a schematic cross-sectional view of a semiconductor portion of a semiconductor device including an overcompensation zone in an edge area in accordance with an embodiment of the invention.
Figure 1B:
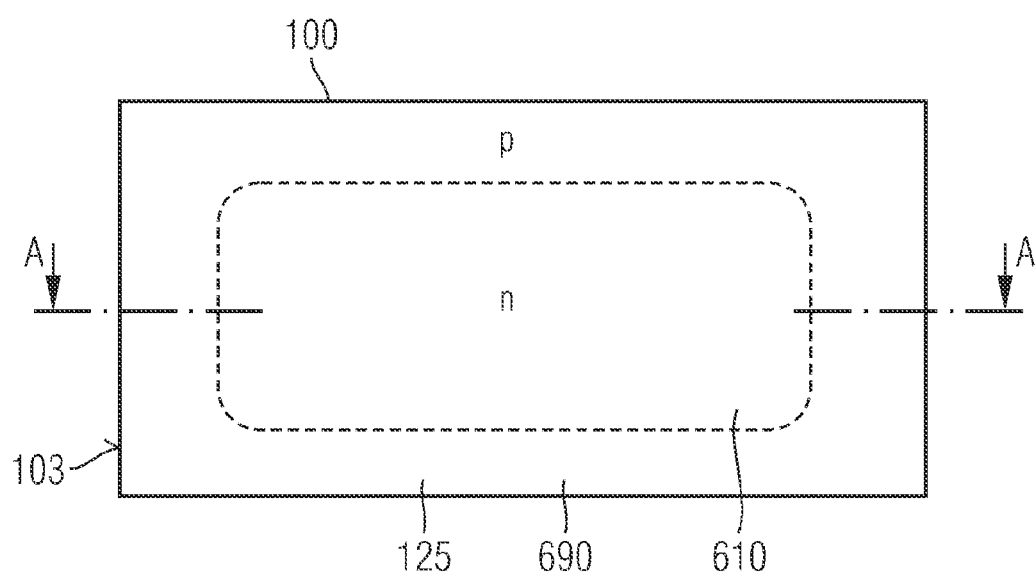
FIG. 1B is a schematic cross-sectional view of the semiconductor portion of FIG. 1A along line B-B.

FIGS. 1A and 1B show a semiconductor portion 100 of a semiconductor device. The semiconductor portion 100 is provided from a single-crystalline semiconductor material, for example silicon Si, silicon carbide SiC, germanium Ge, a silicon germanium crystal SiGe, gallium nitride GaN or gallium arsenide GaAs. The semiconductor portion 100 has a first surface 101 and an opposite second surface 102 which are parallel to each other. A distance between the first and second surfaces 101, 102 is at least 5 µm, for example at least 50 µm. An outer surface 103 tilted to first and second surfaces 101, 102 connects the first and second surfaces 101, 102. The semiconductor portion 100 may have a rectangular shape with an edge length in the range of several millimeters. The normal to the first and second surfaces 101, 102 defines a vertical direction and directions orthogonal to the normal direction and parallel to the first and second surfaces 101, 102 are lateral directions.

As shown in FIG. 1A, the semiconductor portion 100 includes a connection layer 130 and a semiconductor layer 120 with a drift zone 121 of a first conductivity type. An impurity distribution in the connection layer 130 may be approximately uniform. A mean impurity concentration in the connection layer 130 is comparatively high, e.g. at least $5 \times 10^{18}$ cm$^{-3}$. The connection layer 130 may extend along the complete second surface 102. A thickness of the connection layer 130 may be at least 30% of the thickness of the semiconductor layer 120.

In case the semiconductor device is a semiconductor diode or an IGFET, the connection layer 130 has the first conductivity type which is the conductivity type of the drift zone 121. In case the semiconductor device is an IGBT, the connection layer 130 has a second conductivity type, which is the opposite of the first conductivity type and the opposite of the conductivity type of the drift zone 121.

The semiconductor layer 120 with the drift zone 121 directly forms the first surface 101 and directly adjoins a process surface of the connection layer 130 which is parallel to the second surface 102. A mean impurity concentration in the drift zone 121 is at least ten times lower than the mean impurity concentration in the connection layer 130. A comparatively sharp step in the vertical impurity profile marks the interface between the connection layer 130 and the drift zone 121. Alternatively, a field stop zone 128 and/or a buffer region of the first conductivity type may be implemented between the drift zone 121 and the connection layer 130 wherein a mean net impurity concentration in a field stop zone 128 is higher than in the drift zone 121 and a mean net impurity concentration in a buffer region is lower than or equal to the mean impurity concentration in the drift zone 121.

In an element area 610, at least one impurity zone 115 of the second conductivity type is formed in the semiconductor layer 120 along the first surface 101 and at a distance to the connection layer 130. The impurity zone 115 may be an anode region of a semiconductor diode. Other embodiments provide a plurality of impurity zones 115 embedding impurity wells of the first conductivity type, respectively, wherein the impurity zones 115 are effective as body zones and the impurity wells are effective as source zones. The body and source zones provide control blocks of switching devices like IGFETs or IGBTs. The semiconductor layer 120 may include further impurity zones of both conductivity types, conductive structures, and/or insulator structures.

For example, the semiconductor layer 120 may include a super junction structure with successively arranged p-doped and n-doped columns for achieving a compensation effect improving the reverse voltage blocking capability of the semiconductor layer 120 without increasing the on-state or forward resistance.

FIG. 1B shows an approximately rectangular element area 610, which may have sharp or rounded corners. The element area 610 includes one or more semiconductor elements defining the function of the semiconductor device, for example a diode, a bipolar transistor, a JFET (junction field effect transistor), an IGFET, for example an MOSFET (metal oxide semiconductor field effect transistor) in the usual meaning including FETs with metal and with non-metal gate electrodes, or an IGBT, wherein each transistor may include a plurality of transistor cells arranged in one or more cell arrays. For example, the element area 610 may include the anode region of a semiconductor diode or the source/emitter and body zones of IGFETs or IGBTs as described above as well as gate electrodes. In addition, the semiconductor portion 100 may include further semiconductor elements like logic circuits, driver circuits, processor circuits or memory circuits.

An edge area 690 may surround the element area 610 in the lateral directions in an outermost region of the semiconductor portion 100. The edge area 690 directly adjoins the element area 610 and may extend along the outer surface 103. The width of the edge area 690 is at least some 10 μm or more than 100 μm and depends on a desired device voltage blocking capability. In the edge area 690 the semiconductor portion 100 may include edge termination elements that shape an electric field gradient such that in the edge area 690 the maximum electrical field strength at least approximates a maximum electrical field strength in the element area 610.

In an on-state or forward mode of the semiconductor device an on-state or forward current flows between the first and second surfaces 101, 102 in the element area 610. No or only a negligible portion of the on-state or forward current flows in the edge area 690.

An overcompensation zone 125 of a conductivity type which is the opposite of the conductivity type of the connection layer 130 is formed in the edge area 690 of the semiconductor portion 100, wherein in the vertical direction a portion of the drift zone 121 is arranged between the first surface 101 and the overcompensation zone 125. For the illustrated embodiment, which refers to IGFETs and diodes, the connection layer 130 has the first conductivity type and the overcompensation zone 125 has the second conductivity type. In the vertical direction, the drift zone 121 separates the overcompensation zone 125 from the first surface 101 and other doped zones or dielectric structures of an edge termination structure.

The overcompensation zone 125 may exclusively include second impurities of the second impurity type. According to an embodiment, the overcompensation zone 125 contains both first impurities of the first conductivity type and second impurities of the second conductivity type, wherein within at least a portion of the overcompensation zone 125 a concentration of the second impurities exceeds the concentration of the first impurities, e.g. by at least 10% for example three times, e.g. by at least 50% or at least three times. The dose of the second impurities may be at least $3e^{13}$ cm$^{-2}$, e.g. $3e^{14}$ or $1e^{15}$ cm$^{-2}$.

According to an embodiment, the first conductivity type is the n-type and the second conductivity type is the p-type. For example, the first impurities are arsenic, antimony or phosphorus atoms and the second impurities are boron, gallium, aluminum, or indium atoms. According to other embodiments, the first conductivity type is the p-type, wherein the first impurities are boron, gallium, aluminum, or indium atoms, and the second impurities are arsenic, antimony or phosphorus atoms.

Immediately after the semiconductor device has switched from a forward or on-state into the reverse or off-state, mobile charge carriers conveying the forward or on-state current and residing in both the element and the edge areas 610, 690 at the time of switching are dissipated into electrodes on the first and second surfaces 101, 102 of the semiconductor portion 100. Charge carriers of the second conductivity type, e.g. holes in the case of an n-FET, are dissipated by an electrode electrically connected at the first surface 101 thereby traversing a depletion zone formed at a pn junction between the impurity zone 115 and the drift zone 121 at a front side. The charge of the mobile charge carriers adds to the charge of the immobile impurity ions and increases the electric field strength such that a dynamic avalanche breakdown may occur at the front side close to the pn-junction.

If the current densities resulting from the dynamic avalanche breakdown caused by charge carriers of the second conductivity type, e.g. holes in the case of an n-FET, at the front side of the semiconductor portion 100 are sufficiently high, current filaments, in which the current density is locally increased, may appear where the semiconductor portion 100 is inhomogeneous. At the n/n+ interface at a rear side of the semiconductor portion 100 in a current filament an increased density of mobile charge carriers of the first conductivity type, e.g. electrons in the case of an n-FET, may locally increase the electrical field strength up to the avalanche field strength such that the electric field profile has a negative gradient between the two peaks at the front and rear sides (Egawa effect) and a dynamic avalanche breakdown that further increases the local current density may occur even at the n/n+ interface between the semiconductor layer 120 and the connection layer 130. The resulting high thermal stress in the concerned current filaments may irreversibly damage the semiconductor portion 100.

In conventional semiconductor devices, an outer portion of the element area 610 directly adjoining the edge area 690 conveys mobile charge carriers from both the edge area 690 and the concerned portion of the element area 610 such that the outer portion of the element area 610 has the highest probability for destructive current filaments to occur. The outer portion of the element area 610 determines the avalanche ruggedness of the total semiconductor device.

Instead, the overcompensation zone 125 of the embodiments reduces the active emitter area in the edge area 690 and, as a result, the local emitter efficiency. The reduced emitter efficiency in turn results in lower current densities in the edge area 690. When switching from the conductive mode into a blocking mode the outer portion of the element area 610 conveys less charge carriers than in conventional devices. Furthermore, the additional impurities in the overcompensation zone 125 reduce both charge carrier mobility and minority carrier lifetime in the edge area 690 which further reduces the injection of free charge carriers in this region.

In addition, in the presence of high densities of mobile charge carriers of the first conductivity type, e.g. electrons in the case of an n-FET, the overcompensation zone 125 injects charge carriers of the second conductivity type, e.g. holes in the case of an n-FET, into the semiconductor layer 120, which partly compensate the charge carriers of the first conductivity type and counter an increase of the electric field strength. The risk of a destructive dynamic avalanche breakdown in consequence of the Egawa effect is reduced. Undesired dynamic avalanche effects along the edge area 690 that may be destructive for the semiconductor device can be avoided such that effects occurring only along the perimeter of the element area 610 do not deteriorate the avalanche ruggedness parameters of the whole device.

The overcompensation zone 125 may extend along all four edges. According to an embodiment, the overcompensation zone 125 may be formed in a circumferential portion of the edge area 690 directly adjoining the outer surface 103 of the semiconductor die 500 or in a circumferential portion offset to the outer surface 103. According to another embodiment, the overcompensation zone 125 is formed approximately in the total edge area 690.

The overcompensation zone 125 may extend to some degree into the element area 610. For example an overlap between the overcompensation zone 125 and the element area 610 may be uniform along one, two or more edges, e.g. along the whole circumference. According to other embodiments, the overcompensation zone 125 includes strip portions extending from the edge area 690 into or through the element area 610. According to another embodiment, the overcompensation zone 125 is not formed in the element area 610 or comprises strip portions aligned with conduction lines for connecting gate electrodes or field electrodes in the element area 610 such that the efficiency of the element area 610 is not decreased by the overcompensation zone 125. A mean net impurity concentration in the overcompensation zone 125 is at least $1 \times 10^{17} cm^{-3}$, e.g. at least $1 \times 10^{18} cm^{-3}$.

The overcompensation zone 125 may extend along the interface between the connection layer 130 and the drift zone 121 and may be formed completely or mainly in the connection layer 130, completely or mainly in the drift zone 121 or in both the connection layer 130 and the drift zone 121. According to an embodiment, the overcompensation zone 125 is formed in a portion of the semiconductor layer 120 oriented to the connection layer 130 and at a distance to the connection layer 130, wherein the distance to the connection layer is smaller than to the first surface 101. The distance to the connection layer 130 may be between 0% and 30% of a vertical extension of the drift zone 121 such that the overcompensation zone 125 is sufficiently close to the n/n+ interface. A vertical extension of the overcompensation zone 125 may be at least 200 nm, for example at least 1 µm such that the overcompensation zone 125 may provide a sufficiently large number of charge carriers. Portions of the drift zone 121 separate the overcompensation zone 125 from other impurity zones and insulator structures of the edge termination structure.

The overcompensation zone 125 is spatially separated from an electrode structure adjoining the second surface and floats.

As shown in FIG. 1A, between the drift zone 121 and the connection layer 130, the semiconductor layer 120 may include a field stop zone 128 of the first conductivity, wherein the field stop zone 128 has a higher mean impurity concentration than the drift zone 121 and a lower mean impurity concentration than the connection layer 130. For example, a mean impurity concentration in the field stop zone 128 exceeds the mean impurity concentration in the drift zone 121 by at least five times and is at least five times lower than the mean impurity concentration in the connection layer 130. In the field stop zone 128 the net impurity concentration may be uniform. According to other embodiments, the field stop zone 128 may include two or more uniformly doped and vertically arranged portions with different impurity concentrations. The impurity concentration in the field stop zone 128 may change with increasing distance to the first surface 101, for example linearly. According to other embodiments a vertical impurity profile of the field stop zone 128 is a Gaussian distribution. Alternatively or in addition to the field stop zone 128, the semiconductor portion 100 may include a buffer region having a mean net impurity concentration which is lower than or equal to the mean net dopant concentration in the drift zone 121.

The overcompensation zone 125 may be formed exclusively within the field stop zone 128, in vertically adjacent sections of the field stop zone 128 and the connection layer 130, or in vertically adjacent sections of the field stop zone 128 and the drift zone 121.

In a similar manner, the overcompensation zone 125 may be formed exclusively within the buffer region, in vertically adjacent sections of the buffer region and the connection layer 130, or in vertically adjacent sections of the buffer region and the drift zone 121.

According to FIG. 1B, the overcompensation zone 125 is or includes a ring surrounding the element area 610, wherein the overcompensation zone 125 directly adjoins both the outer surface 103 and the element area 610 and extends over the complete edge area 690. According to other embodiments, the overcompensation zone 125 may be arranged at a distance to the outer surface 103, or to the element area 610, or to both the outer surface 103 and the element area 610.

Figure 1C:
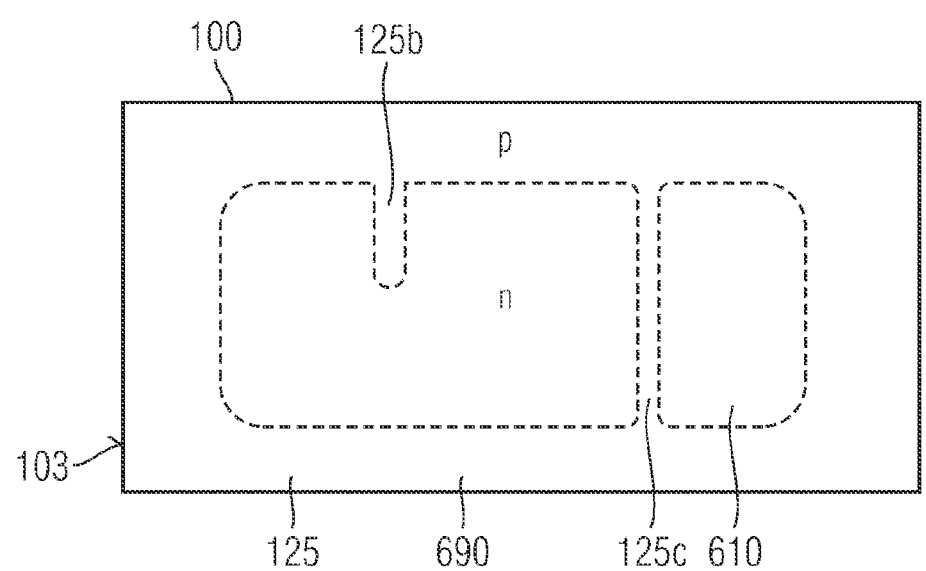
FIG. 1C is a schematic cross-sectional view of a semiconductor portion of a semiconductor device in accordance with an embodiment providing an overcompensation zone with strip portions extending into an element area.

In FIG. 1C the overcompensation zone 125 includes strip portions 125b extending from the edge area 690 into and ending within the element area 610. The strip portions 125b may be aligned with connection lines provided on the first surface 101 to connect conductive structures within the element area 610 with each other and/or with contact pads or electric circuits outside the element area 610. For example, the strip portions 125b are vertically aligned with gate fingers connecting gate electrodes within the element area 610. Alternatively or in addition, the overcompensation zone 125 may include further strip portions 125c extending from the edge area 690 into the element area 610 and traversing the complete element area 610. The further strip portions 125c may be provided in the vertical projection of conduction lines provided above the first surface 101. For example, the further strip portions 125c may be arranged in the vertical projection of field electrode connection lines.

Figure 1D:
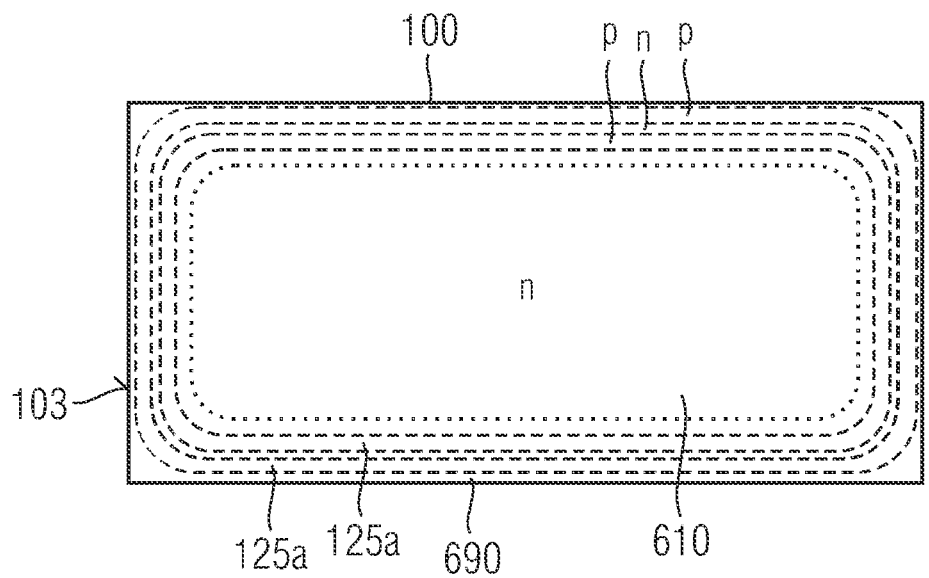
FIG. 1D is a schematic cross-sectional view of a semiconductor portion of a semiconductor device in accordance with an embodiment providing an overcompensation zone with two spatially separated islands.

The overcompensation zone 125 of FIG. 1D includes two spatially separated concentric ring-shaped islands 125a spaced from the outer surface 103 and the element area 610.

Figure 1E:
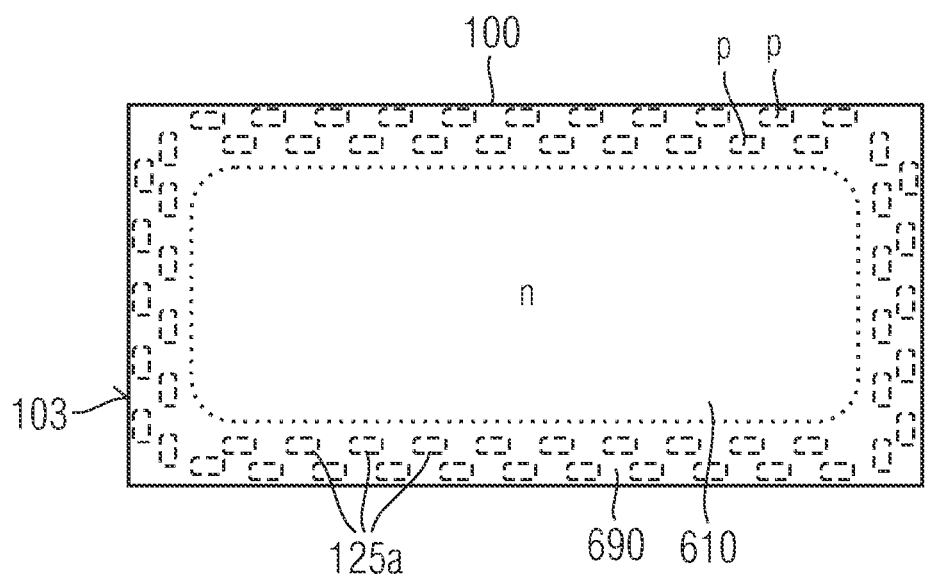
FIG. 1E is a schematic cross-sectional view of a semiconductor portion of a semiconductor device in accordance with an embodiment providing an overcompensation zone including a plurality of spatially separated islands.

FIG. 1E shows an overcompensation zone 125 including a plurality of spatially separated islands 125a. The lateral cross-sections of the islands may be circles, ovals, ellipsoids, or polygons with sharp or rounded corners, e.g. rectangles. The spatially separated islands 125a may be regularly arranged along one, two or more concentric rings around the element area 610. Alternatively, the overcompensation zone 125 may have the inverse shape and may include a connected area with complementary doped "holes" whose lateral cross-sections may be circles, ovals, ellipsoids, or polygons with sharp or rounded corners, e.g. rectangles. The holes may be regularly arranged along one, two or more concentric rings around the element area 610.

A lateral voltage drop over the compensation zone 125 is a function of its lateral extension. The voltage drop over each single island 125a is smaller than the voltage drop over a one-part compensation zone surrounding the element area 610. At sufficiently low lateral voltage drops, the islands 125a do not inject charge carriers at the comparatively low current densities in the normal operation mode of the semiconductor device.

FIGS. 2A and 2B refer to impurity profiles along lines I-I and II-II of FIG. 1A. FIG. 2A shows the vertical impurity profiles (impurity concentration gradients) of atoms of a first impurity type (first impurities) in the element area 610. The connection layer 130 may have a uniform initial impurity concentration greater than $10^{17}$ cm$^{-3}$, for example about $5 \times 10^{18}$ cm$^{-3}$ or even higher. The field stop zone 128 may be an epitaxial layer with a uniform initial impurity concentration that is lower than that of the connection layer 130 by at least five times. According to an embodiment, the initial impurity concentration in the field stop zone 128 may be at most $5 \times 10^{16}$ cm$^{-3}$. A drift zone 121 of the semiconductor layer 120 is formed from an epitaxial layer having a uniform initial impurity concentration that is lower than that of the field stop zone 128 by at least five times, for example at least $10^{14}$ cm$^{-3}$. According to the embodiment, the initial impurity concentration in the drift zone 121 is $2 \times 10^{14}$ cm$^{-3}$ and the initial impurity concentration in the field stop zone 128 is $2 \times 10^{15}$ cm$^{-3}$.

In super junction devices the impurity concentration in the portion of the drift zone 121 forming part of the super junction structure may have a mean net impurity concentration between $1 \times 10^{15}$ and $1 \times 10^{17}$ cm$^{-3}$. Accordingly, the initial impurity concentration in the field stop zone 128 may be higher than $2 \times 10^{15}$ cm$^{-3}$, for example up to $2 \times 10^{16}$ cm$^{-3}$.

According to another embodiment, the initial impurity concentrations of the field stop zone 128 and/or the drift zone 121 are not uniform but vary along the vertical direction. The impurities in the connection layer 130 are e.g. arsenic atoms and the impurities in the field stop zone 128 are phosphorus atoms. The impurity profile 201a gives the initial impurity profile along line I-I of FIG. 1A for phosphorus and the impurity profile 201b for arsenic atoms.

The final impurity profiles 211a, 211b result from the initial impurity profiles 201a, 201b by applying a thermal anneal at a high temperature, e.g. 1150 degree Celsius for 200 minutes. During the thermal anneal the impurities diffuse from higher doped regions to lower doped regions whereby the impurity profiles become smoother resulting e.g. in the final impurity profiles 211a and 211b.

FIG. 2B shows the corresponding impurity profiles in the edge area 690. In addition to the impurity profiles 201a, 201b, 211a, 211b of FIG. 2A, FIG. 2B shows an initial impurity profile 202 for second impurities of the second conductivity type resulting from implanting boron at the interface between the semiconductor layer 120 and the connection layer 130 with an area density of $2 \times 10^{14}$ cm$^{-2}$ and an implant energy of 80 keV in the edge area 690. The final impurity profile 212 for the second impurities results after the thermal anneal. The initial impurity profile 202, i.e. the boron implant, is controlled such that after the anneal the boron implant overcompensates the first impurities in a predefined overcompensation zone 125. The conductivity type of the overcompensation zone 125 is the opposite of that of the connection layer 130 and the drift zone 121. The resulting reduced emitter efficiency results in lower current densities in the edge area 690. At high field strengths along the pn junction along the edges of the overcompensation zone 125, the overcompensation zone 125 injects mobile charge carriers that compensate the charge of mobile charge carriers near the n/n+ interface and in turn counter a further increase of the electric field strength and defer triggering of an avalanche breakdown at the n/n+ interface. The shaded area in FIG. 2B between the final impurity profiles 212, 211b and 211a defines the overcompensation zone 125.

The implant of the second impurities may be performed before the semiconductor layer 120 is grown on the connection layer 130 by epitaxy. A high temperature process, e.g. an RTA (rapid thermal annealing) process or a melting or non-melting laser process may be used to anneal implant damages caused by the second impurities prior to the epitaxial deposition. An oxidation process may be performed to cure implant damages occurring at high implant doses, wherein the grown oxide is removed before further portions of the semiconductor layer 120 are grown by epitaxy on the connection layer 130. Alternatively, the implant of the second impurities may be performed after providing a first portion of the field stop zone 128 by epitaxy. The implant damages caused by the implanted impurities may be annealed and then a second portion of the field stop zone 128 may be provided.

FIGS. 3A and 3B relate to an embodiment using a co-implantation of first and second impurities into the connection layer 130 and show impurity profiles along lines I-I and II-II of FIG. 1B. According to FIG. 3A, in the element area 610 the connection layer 130 shows an initial impurity profile 301b of arsenic atoms with a uniform initial impurity concentration of about $5 \times 10^{18}$ cm$^{-3}$ corresponding to an electrical resistivity of about 10 mΩcm. A field stop zone 128 directly adjoins to the connection layer 130. The field stop zone 128 has an initial uniform impurity concentration of first impurities of about $2 \times 10^{15}$ cm$^3$. A drift zone 121 has a uniform initial impurity concentration of phosphorus atoms of about $2 \times 10^{14}$ cm$^{-3}$. After a thermal anneal for 200 minutes at 1150 degree Celsius the final impurity profile 311a for phosphorus and the final impurity profile 311b for arsenic result from the initial impurity profiles 301a, 301b.

FIG. 3B shows the impurity profiles in the edge area 690. The initial and final impurity profiles 301a, 301b, 311a, 311b correspond to those of FIG. 3A. Further, for forming the overcompensation zone 125, an initial impurity profile 303 for boron atoms is generated using an implant of $3 \times 10^{14}$ cm$^{-2}$ boron and an implantation energy of 70 keV. An additional implant of phosphorus atoms may be used to tune exactly the placement, the dimensions and the impurity profile of the overcompensation zone 125. For example, the phosphorus atoms are implanted with an implant dose of $2 \times 10^{14}$ cm$^{-2}$ at an implantation energy of 45 keV at the interface between the connection layer 130 and the semiconductor layer 120 as shown with initial doping profile 302. Due to the similar diffusion properties of phosphorus and boron, after an anneal the placement and dimensions of the shaded area 125x between the final impurity profiles 312, 313 which defines the overcompensation zone 125 are precisely defined.

The additional phosphorus implant increases scattering and recombination of charge carriers which results in reduced charge carrier mobility and minority carrier lifetime in the edge area 690 and with it in a reduced injection of free charge carriers in this region. The additional phosphorus implant reduces a possible reduction of the breakdown voltage and an undesired injection under different operating conditions.

Where the embodiments of FIGS. 3A and 3B combine a phosphorus/boron co-implant with an arsenic connection layer, other embodiments may provide both implants in combination with another connection layer material to make use of the reduction of charge carrier mobility and minority carrier lifetime.

The embodiments provide local reduction of the injection of free charge carriers in the edge area by a local compensation-like implant for increasing the dynamic robustness of semiconductor devices.

According to other embodiments, the formation of the overcompensation zone 125 may be combined with the formation of a field stop zone 128 in the semiconductor layer 120 both in the edge area 690 and the element area 610 without an epitaxy process providing different doping concentrations. For example, a field stop zone 128 may be provided by increasing a local phosphorus concentration with reference to a local boron concentration or by providing a significantly higher implant energy for boron than for phosphorus. The resulting impurity profile may result in a field stop zone 128 showing a mean impurity concentration which is high compared to a field stop zone 128 formed from a layer grown by epitaxy.

A mean net impurity concentration in the field stop zone 128 in the range of $10^{15}$ cm$^{-3}$ to $10^{16}$ cm$^{-3}$ or higher may shift the start of charge carrier generation at the n/n$^+$ interface to higher current densities.

FIG. 4 shows a semiconductor diode 500. A semiconductor portion 100 includes a highly n$^+$ doped connection layer 130 and a semiconductor layer 120. The connection layer 130 may be a substrate layer on which the semiconductor layer 120 is grown by epitaxy. According to other embodiments, the connection layer 130 is grown by epitaxy on an auxiliary substrate which is removed after the epitaxy process by a process thinning the semiconductor portion 100. In other embodiments, the drift zone 121 may be a substrate layer and the connection layer 130 is formed by an activated implant from the second surface 102.

The semiconductor layer 120 includes a drift zone 121 having a lower concentration of n-type impurities than the connection layer 130. A highly p$^+$ doped impurity zone 115 forms an anode region extending along a first surface 101 of the semiconductor portion 100. The anode region is formed at a distance to an outer surface 103 tilted to the first surface 101. The highly p$^+$ doped anode region defines an element area 610 which is surrounded by an edge area 690.

A first electrode structure 310 electrically connected to the anode region may directly adjoin the first surface 101. A second electrode structure 320 may be formed at a second surface 102 of the semiconductor portion 100 parallel and opposed to the first surface 101. The second electrode structure 320 is electrically connected to the connection layer 130.

Each of the first and second electrode structures 310, 320 may consist of or contain, as main constituent(s) aluminum Al, copper Cu, or alloys of aluminum or copper, for example AlSi, AlCu or AlSiCu. According to other embodiments, one or both of the first and second electrode structures 310, 320 may contain, as main constituent(s), nickel Ni, titanium Ti, silver Ag, gold Au, platinum Pt and/or palladium Pd. For example, at least one of the first and second electrode structures 310, 320 includes two or more sub-layers, each sub-layer containing one or more of Ni, Ti, Ag, Au, Pt, and Pd as main constituent(s), e.g. silicides and/or alloys.

In the edge area 690 spatially separated islands 125a form an overcompensation zone 125 in between the connection layer 130 and the drift zone 121. In the islands 125a, a counter implant locally overcompensates the n impurities of the semiconductor portion 100. According to the illustrated embodiment the overcompensation zone 125 is formed in portions of both the drift zone 121 and the connection layer 130. The overcompensation zone 125 is spaced from the second surface 102, is not electrically connected to the second electrode structure 320, and floats.

The islands 125a reduce emitter efficiency and inject holes into the surrounding n-doped structures in case a high electric field strength locally appears near the pn junctions of the islands 125a such that the risk of a destructive avalanche breakdown along an outer portion of the element area 610 is reduced.

Other embodiments may provide a field stop zone with a mean impurity concentration that is lower than in the connection layer 130 and higher than in the drift zone 121, wherein at least a part of the overcompensation zone 125 is formed in the field stop zone. According to another embodiment, the overcompensation zone 125 is restricted to the connection layer 130 or the field stop zone.

In FIG. 5A an IGBT 500 includes a semiconductor portion 100 with a highly p$^+$ doped connection layer 130. A semiconductor layer 120 including an n$^-$ doped drift zone 121 is provided in direct contact with the connection layer 130. An n doped field stop zone 128 may be provided in the semiconductor layer 120 between the connection layer 130 and the n$^-$ doped drift zone 121. In an element area 610, p-doped impurity zones 115 forming body zones separate n$^+$ doped emitter zones 110, which are formed as impurity wells within the body zones, from the drift zone 121. A potential applied to gate electrodes 210 arranged in trenches extending through the impurity zones 115 into the drift zone 121 and separated from the impurity zones (body zones) 115 by gate dielectrics 205 control a current through the impurity zones 115.

A first electrode structure 310 is formed at the first surface 101 and is electrically connected with the impurity zones 115 and the emitter zones 110. A second electrode structure 320 directly adjoins the connection layer 130 and is electrically connected to the connection layer 130. As regards structure and materials of the first and second electrode structures, reference is made to the description of FIG. 4.

In an edge area 690 extending along an outer surface 103 a field plate termination structure may be provided including a dielectric layer 295 between the semiconductor portion 100 and the first electrode structure 310 and a low p– doped junction termination extension region 195 formed in the semiconductor layer 120 along the first surface 101. At the second surface 102 parallel to the first surface 101, the second electrode structure 320 and the connection layer 130 may extend over the complete cross-sectional area of the semiconductor portion 100.

An n-type compensation zone 125, which may be a one-piece zone or which may include spatially separated islands 125a is formed in the edge area 690 in a section of the semiconductor portion 100 oriented to the second surface 102. The islands 125a may be formed partly or totally in the semiconductor layer 120. In the islands 125a a counter implant overcompensates the p type impurities of the semiconductor layer 120.

When switching from a forward conductive mode to the forward blocking mode, the n-doped islands 125a may inject electrons compensating for holes previously injected from the rear side in the forward on-state.

Figure 6A:
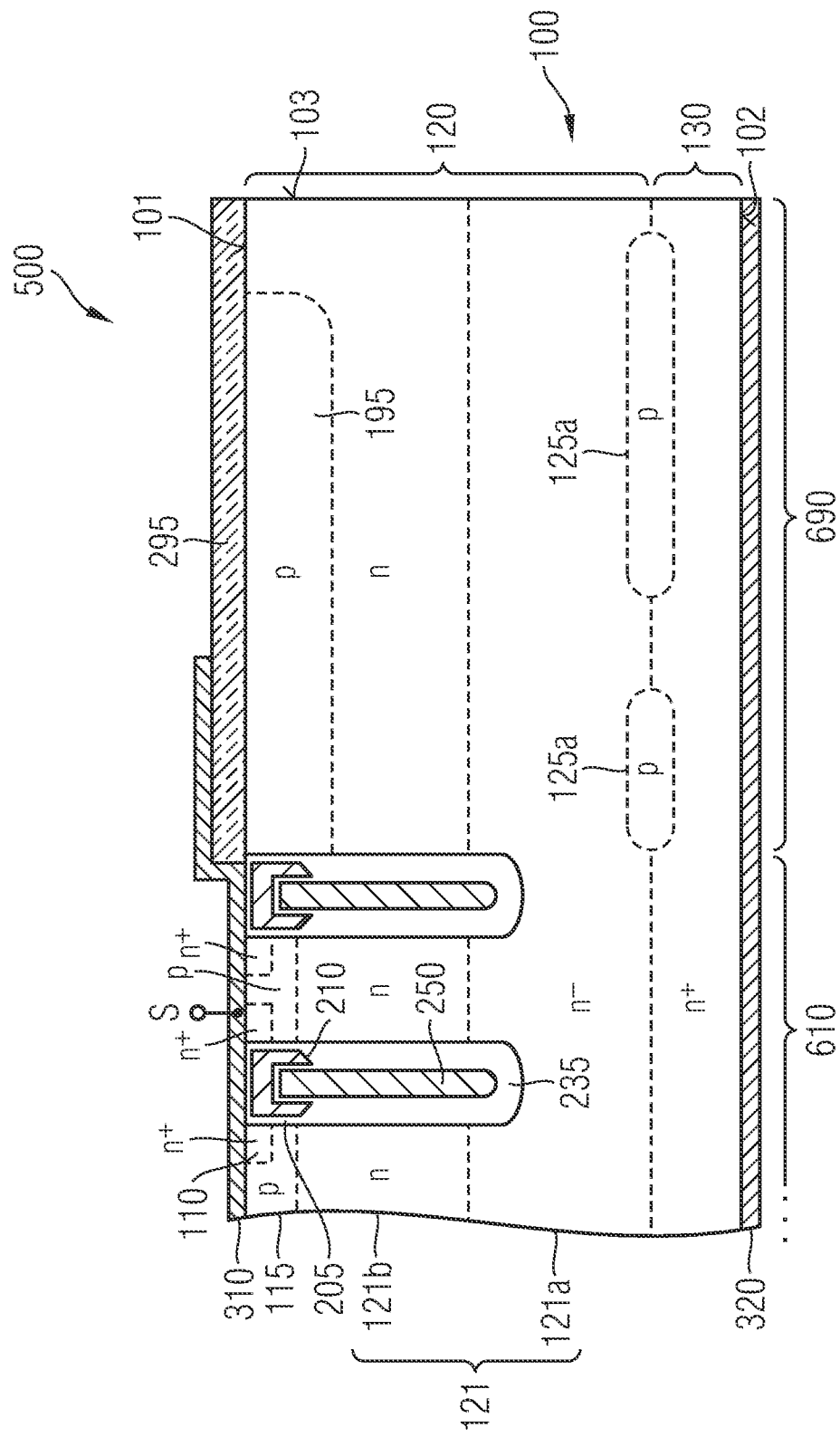
FIG. 6A is a schematic cross-sectional view of an IGFET (insulated gate field effect transistor) in accordance with an embodiment providing a field plate termination structure and an overcompensation zone with spatially separated islands.

According to the embodiment of FIG. 5B, the second electrode structure 320 is absent in the edge area 690. The connection layer 130 may be absent in the edge area 690 or may include a high dynamic robustness region 131 locally reducing the emitter efficiency in the edge area 690. The n-doped islands 125a may extend into the high dynamic robustness region 131. FIG. 6A refers to an n-IGFET with an n doped connection layer 130. The drift zone 121 includes a lower doped portion 121a directly adjoining to the connection layer 130 and a higher doped portion 121b between the lower doped portion 121a and the first impurity zones 115 forming body zones. Gate trenches include field electrodes 250 separated from the drift zone 121 by a field dielectric 235, which is thicker than the gate dielectric 205. In the edge area 690 a field plate termination structure includes a dielectric layer 295 separating the first electrode structure 310 from the semiconductor portion 100 and a p doped junction termination extension region 195 formed in the semiconductor layer 120 and extending from the cell area 610 into the edge area 690. The junction termination extension region 195 is spaced from the outer surface 103.

P doped islands 125a are formed in the edge area 690 along an interface between the semiconductor layer 120 and the connection layer 130. The islands 125a are spaced from both the second surface 102 and the junction termination extension region 195. Portions of the drift zone 121 completely encapsulate the overcompensation zone with the islands 125a against other structures formed between the first surface 101 and the islands 125a. The p doped islands 125a are completely embedded in n doped regions.

The drift zone 121 may include a higher doped portion 121b between the gate trenches and a lower doped portion 121a between the higher doped portion 121b and the connection layer 130.

Figure 6B:
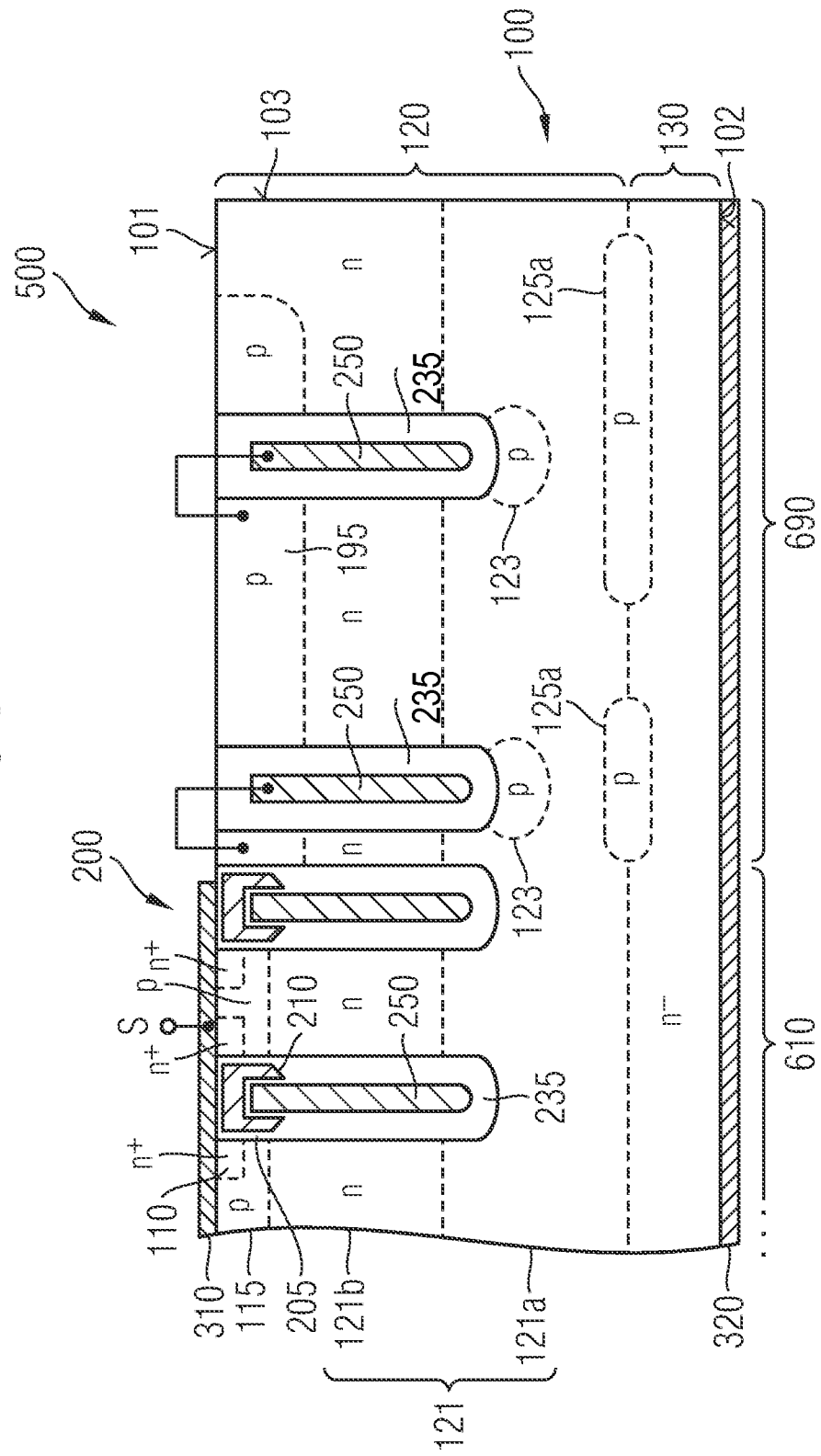
FIG. 6B is a schematic cross-sectional view of an IGFET in accordance with an embodiment providing termination trenches and an overcompensation zone with spatially separated islands.

The n-IGFET of FIG. 6B provides an edge termination structure with field electrodes 250 arranged in trenches extending from the first surface 101 through the higher doped portion 121b of the drift zone 121 into the lower doped portion 121a. Thick field electrode dielectrics 235 electrically insulate the field electrodes 250 from the surrounding semiconductor material. Below the trenches with the field electrodes 250 p type "bubbles" 123 shape the electric field in the edge area 690 such that the curvatures (bending radius) of equipotential lines in the reverse mode are smoothed. Portions of the drift layer 121 separate the bubbles 123 and the islands 125a. P doped island 125a of an overcompensation zone are spatially separated from the bubbles 123 by portions of the drift zone 121.

Figure 6C:
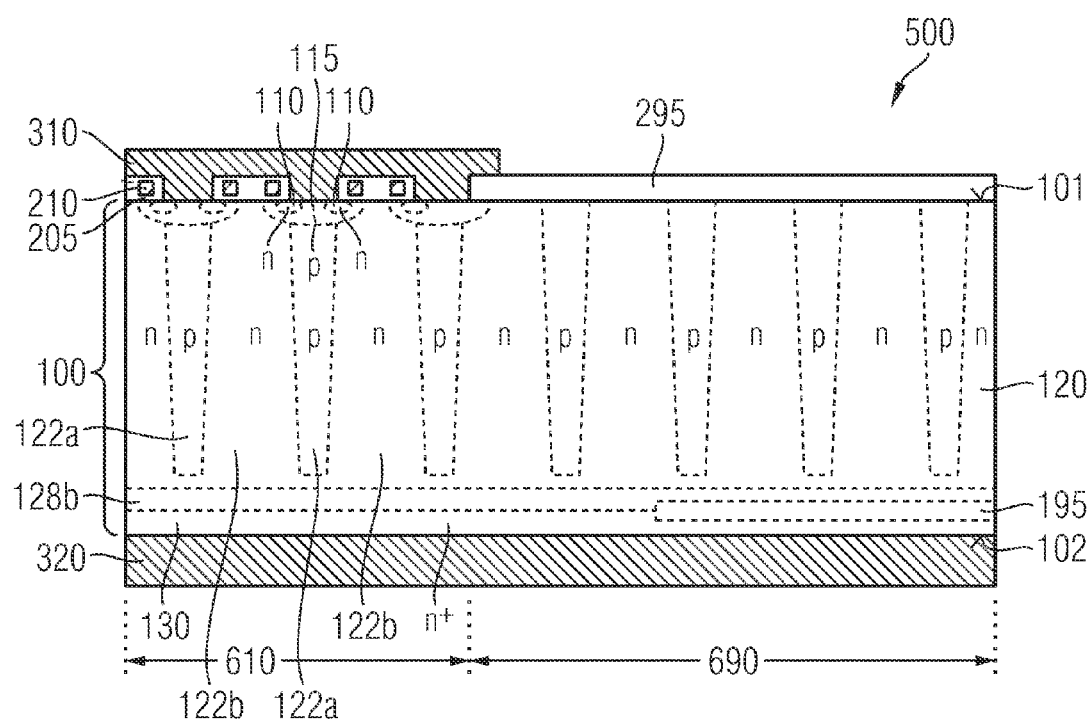
FIG. 6C is a schematic cross-sectional view of an IGFET with a super junction structure in accordance with another embodiment.

FIG. 6C refers to a super junction device. In the semiconductor layer 120 p doped columns 122a and n doped columns 122b alternate in a regular manner. The columns may be stripes. According to other embodiments, the columns may have a circular, ellipsoid, oval or a rectangular cross-sectional area with rounded corners, for example a square or approximately a square. When a reverse voltage is applied to the super junction n-IGFET of FIG. 6C the n type portion 120a are fully depleted such that a comparatively high reverse breakdown voltage can be achieved at comparatively high impurity concentrations in the n type columns 120b providing in turn a comparatively low on-state resistance. A buffer region 128b may be provided between the connection layer 130 and the drift zone 121, wherein the mean impurity concentration in the buffer region 128b is lower than in the connection layer 130. The impurity concentration in the n columns 122b may be at least $1\times10^{15}$ and at most $1\times10^{17}$ cm$^{-3}$. According to other embodiments a field stop zone may be provided instead of or in addition to the buffer region 128b. The mean impurity concentration in the field stop zone may be at least $2\times10^{15}$ and at most $2\times10^{16}$ cm$^{-3}$.

FIG. 7 refers to a method of manufacturing a semiconductor device. A semiconductor layer including a drift zone of a first conductivity type is provided on a connection layer (702). An overcompensation zone of a second conductivity type is formed in an edge area surrounding an element area of the semiconductor device. The overcompensation zone may contain first impurities of the first conductivity type and second impurities of a second conductivity type which is the opposite of the first conductivity type. (704).

In an element area surrounded by the edge area at least one impurity zone of the second conductivity type is formed that adjoins a first surface of the semiconductor layer opposite to the connection layer (706).

A masked implant may be used to implant the second impurities into the edge area. The implant may be activated by a thermal anneal, or a laser induced melting/fusing process. According to an embodiment, the second impurities are boron atoms and the first impurities are phosphorus atoms. According to an embodiment, the boron implant may be activated contemporaneously with the activation of a phosphorus implant.

According to embodiments related to power MOSFETs or IGBTs, the implant(s) provided for generating the overcompensation zone may be performed on a surface of a connection layer, on which the semiconductor layers are epitaxially grown.

Forming the overcompensation zone may include performing a co-implantation using second impurities of the second conductivity type in combination with first impurities of the first conductivity type.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising a semiconductor portion, the semiconductor portion comprising:
    a semiconductor layer including a drift zone of one, first conductivity type and at least one anode region or body zones of a second, opposite conductivity type that adjoins a first surface of the semiconductor portion and that is, electrically connected to a first electrode structure;
    an element region formed in a lateral center of the semiconductor layer and comprising the anode region or the body zones;
    an edge region laterally surrounding the element region and extending, in the lateral direction, from the element region to an outer surface of the semiconductor layer, wherein the outer surface extends between the first surface and a second surface of the semiconductor layer that is opposite the first surface, wherein, in the element region, the drift zone forms pn junctions with the anode region or the body zones,
    a connection layer directly adjoining the semiconductor layer at the second surface, wherein a mean impurity concentration in the connection layer is at least ten times greater than a mean impurity concentration in the drift zone; and
    an overcompensation zone disposed in the edge region wherein the overcompensation zone and the connection layer have opposite conductivity types and a portion of the drift zone is arranged between the first surface and the overcompensation zone in a vertical projection of the overcompensation zone with respect to the first surface.

2. The semiconductor device according to claim 1, wherein
the connection layer has the first conductivity type.

3. The semiconductor device according to claim 1, wherein
the overcompensation zone contains at least first impurities of the first conductivity type and second impurities of the second conductivity type, a concentration of the second impurities locally exceeding a concentration of the first impurities.

4. The semiconductor device according to claim 3, wherein
the concentration of the second impurities exceeds the concentration of the first impurities in portions of the overcompensation zone by at least 10%.

5. The semiconductor device according to claim 3, wherein
the first impurities include phosphorus atoms and the second impurities are boron atoms.

6. The semiconductor device according to claim 1, wherein
the overcompensation zone is not formed in the element region.

7. The semiconductor device according to claim 1, wherein
the overcompensation zone is formed in a section of the semiconductor layer closer to the connection layer than to the first surface.

8. The semiconductor device according to claim 1, wherein
the semiconductor device is a diode comprising the anode region and wherein the connection layer has the first conductivity type.

9. The semiconductor device according to claim 1, wherein
the semiconductor device is an insulated gate field effect transistor comprising the body regions, wherein the connection layer has the first conductivity type, the semiconductor device further comprising impurity wells of the first conductivity type, the impurity wells formed in the body regions and adjoining the first surface.

10. The semiconductor device according to claim 1, wherein
the semiconductor layer comprises a field stop zone directly adjoining the connection layer, the field stop zone having the first conductivity type, a mean impurity concentration in the field stop zone being higher than an impurity concentration in the drift zone and a mean impurity concentration in the connection layer exceeding at least five times the mean impurity concentration in the field stop zone, and
at least a portion of the overcompensation zone is formed in the field stop zone.

11. The semiconductor device according to claim 1, wherein
the semiconductor layer comprises a buffer region directly adjoining the connection layer, the buffer region having the first conductivity type, a mean net impurity concentration in the buffer region being lower than an impurity concentration in the drift zone and a mean net impurity concentration in the connection layer being at least five times the mean net impurity concentration in the buffer region, and
at least a portion of the overcompensation zone is formed in the buffer region.

12. The semiconductor device according to claim 1, wherein
the overcompensation zone directly adjoins the connection layer.

13. The semiconductor device according to claim 1, wherein
a vertical extension of the overcompensation zone in a direction perpendicular to the first surface is at least 200 nm.

14. The semiconductor device according to claim 1, wherein
the overcompensation zone is formed at a distance to the first and a second, opposite surface of the semiconductor portion.

15. The semiconductor device according to claim 1, wherein
the overcompensation zone comprises a plurality of spatially separated islands.

16. The semiconductor device according to claim 1, wherein
a thickness of the connection layer may be at least 30% of a thickness of the semiconductor layer.

17. A power field effect transistor, comprising a semiconductor portion, the semiconductor portion comprising:
a semiconductor layer including a drift zone and at least one anode region or body zone of a second, opposite conductivity type that directly adjoins a first surface of the semiconductor portion and that is electrically connected to a first electrode structure;
an element region formed in a lateral center of the semiconductor layer and comprising the anode region or the body zones;
an edge region laterally surrounding the element region and extending, in the lateral direction, from the element region to an outer surface of the semiconductor layer, wherein the outer surface extends between the first surface and a second surface of the semiconductor layer that is opposite the first surface, wherein the drift zone comprises p-doped columns and n-doped columns horizontally alternating in a regular manner in the element region and in the edge region,
a connection layer of the first conductivity type directly adjoining the semiconductor layer at the second surface, wherein a meat impurity concentration in the connection layer is at least ten times greater than a mean impurity concentration in the drift zone; and
an overcompensation zone of the second conductivity type disposed in the edge region, and vertically spaced from the p-doped columns and from the n-doped columns, wherein a portion of the drift zone is arranged between the first surface and the overcompensation zone in a vertical projection of the overcompensation zone with respect to the first surface.

18. A power insulated gate bipolar transistor, comprising a semiconductor portion, the semiconductor portion comprising:
a semiconductor layer including a drift zone of one, first conductivity type and at least one anode region or body zones of a second, opposite conductivity type that adjoins a first surface of the semiconductor portion and that is, electrically connected to a first electrode structure;
an element region formed in a lateral center of the semiconductor layer and comprising the anode region or the body zones;
an edge region laterally surrounding the element region and extending, in the lateral direction, from the element region to an outer surface of the semiconductor layer, wherein the outer surface extends between the first surface and a second surface of the semiconductor layer that is opposite the first surface, wherein, in the element region, the drift zone forms pn junctions with the anode region or the body zones, a connection layer directly adjoining the semiconductor layer at the second surface, wherein a mean impurity concentration in the connection layer is at least ten times greater than a mean impurity concentration in the drift zone; and an overcompensation zone of the first conductivity type disposed in the edge region wherein, in a vertical projection of the overcompensation zone with respect to the first surface, a portion of the drift zone is arranged between the first surface and the overcompensation zone.

19. The power insulated gate bipolar transistor according to claim 18, wherein the overcompensation zone is formed at a distance to the first surface and a second, opposite surface of the semiconductor portion.

20. A method of manufacturing a semiconductor device, the method comprising:

providing a semiconductor layer comprising a drift zone of one, first conductivity type in an element region and in an edge region, the semiconductor layer adjoining a connection layer, wherein a mean impurity concentration in the connection layer is at least ten times a mean impurity concentration in the drift zone, providing an overcompensation zone of a conductivity type opposite to the conductivity type of the connection layer in the edge region, wherein a portion of the drift zone is formed between a first surface of the semiconductor layer and the overcompensation zone and in a vertical projection of the overcompensation zone with respect to an interface between the connection layer and the semiconductor layer; and providing, in the element region, at least one anode region or body zones of a second conductivity type, which is complementary to the first conductivity type, the at least one anode region or the body zones adjoining the first surface of the semiconductor layer opposite to the connection layer and, electrically connected to a first electrode structure, the element region being laterally surrounded by the edge region that extends in the lateral direction, from the element region to an outer surface of the semiconductor layer, wherein the outer surface extends between the first surface and a second surface of the semiconductor layer that is opposite the first surface.

21. The method according to claim 20, further comprising:

providing a first electrode structure on the first surface, the first electrode structure electrically connected to the impurity wells in the element area.

22. The method according to claim 20, wherein providing the overcompensation zone comprises introducing impurities of the conductivity type opposite to the conductivity type of the connection layer through at least one opening of an impurity mask into an impurity section of a process surface of the connection layer, and growing, by epitaxy, the semiconductor layer on the connection layer, wherein the impurity section corresponds to the edge area.

23. The method according to claim 20, wherein providing the overcompensation zone comprises growing, by epitaxy, a first section of the semiconductor layer on the connection layer, introducing impurities of the conductivity type opposite to the conductivity type of the connection layer through at least one opening of an impurity mask into an impurity section of a process surface of the first section of the semiconductor layer, wherein the impurity section corresponds to the edge area, and growing, by epitaxy, a second section of the semiconductor layer on the first section.

* * * * *